(12) United States Patent
Kane

(10) Patent No.: US 6,587,258 B1
(45) Date of Patent: Jul. 1, 2003

(54) ELECTRO-OPTIC ELECTRIC FIELD PROBE

(75) Inventor: Daniel J. Kane, Santa Fe, NM (US)

(73) Assignee: Southwest Sciences Incorporated, Sante Fe, NM (US)

( * ) Notice: Subject to any disclaimer, the term of this patent is extended or adjusted under 35 U.S.C. 154(b) by 268 days.

(21) Appl. No.: 09/815,812

(22) Filed: Mar. 23, 2001

Related U.S. Application Data

(60) Provisional application No. 60/191,909, filed on Mar. 24, 2000.

(51) Int. Cl.[7] ........................... G02F 1/37; G01R 31/308
(52) U.S. Cl. ........................ 359/328; 372/22; 324/752
(58) Field of Search ................................ 359/326–332; 372/21–22; 324/752

(56) References Cited

U.S. PATENT DOCUMENTS

| | | | | | |
|---|---|---|---|---|---|
| 4,928,058 | A | * | 5/1990 | Williamson | 324/96 |
| 6,014,032 | A | * | 1/2000 | Maddix et al. | 324/762 |
| 6,059,982 | A | * | 5/2000 | Palagonia et al. | 216/11 |
| 6,072,179 | A | * | 6/2000 | Paniccia et al. | 250/341.4 |

OTHER PUBLICATIONS

Aktsipetrov, O.A., et al., "Optical Second–Harmonic Generation Induced by a dc Electric Field at the Si–SiO$_2$ Interface," *Optics Letters,* vol. 19, No. 18 (Sep. 15, 1994), pp. 1450–1452.

Butcher, P.N., et al., "The Elements of Nonlinear Optics" Cambridge Univ. Press, p. 26, Table 2.1 (1990).

Fowler, A., "On Some Modern Uses of the Electron in Logic and Memory," *Physics Today,* pp 50–54 (Oct. 1997).

Kane and Peterson, presentations entitled "Probing E–Fields.." and Probing Electronic Devices presented at OSA Annual Meeting, Providence RI (Oct. 2000) and OSA Meeting, Kaua'i HI (Aug. 2000).

Kittel, C., et al., "Second Edition—Thermal Physics" Textbook, W.H. Freeman & Co, San Francisco, pp 373–378 (1980).

Lüpke, G., et al., "Optical Second–Harmonic Generation as a Probe of Electric–Field–Induced Perturbation of Centrosymmetric Media," *Optics Letters,* vol. 20, No. 19, pp 1997–1999 (Oct. 1, 1995).

(List continued on next page.)

*Primary Examiner*—John D. Lee
(74) *Attorney, Agent, or Firm*—Jeffrey D. Myers

(57) ABSTRACT

A non-invasive electro-optic probe and probe method for probing electric fields in semiconductor devices comprising directing laser output at a semiconductor device to be probed employing a laser having an operating wavelength such that photon energy of a second harmonic wavelength of the operating wavelength is below the band gap of a semiconductor comprised by the semiconductor device and detecting second harmonic wavelength but not operating wavelength radiation from the semiconductor device.

20 Claims, 3 Drawing Sheets

OTHER PUBLICATIONS

Mullin, C.S., et al., "Picosecond Studies of Optical Second Harmonic Generation in Atomic Vapor," *Physical Rev. Letters*, vol. 74, No. 14, pp 2678–2681.

Murooka, Y., et al., "Optical High–Sensitive Field Sensor Using a Pockels Crystal," *Rev. Sci, Instrum.*, vol. 63, No. 12, pp 5582–5585 (Dec. 1992).

Meyer, C., et al., "Electronic Transitions at SI(111)SiO$_2$ and SI(111/Si$_3$ N$_4$ Interfaces Studied by Optical Second–Harmonic Spectoscopy," *Physical Review Letters*, vol. 74, No. 15, pp 3001–3004 (Apr. 10, 1995).

Nahata, A., et al., "High–Speed Electrical Sampling Using Optical Second–Harmonic Generation," *Appl. Phys. Lett.*, vol. 69, No. 6, pp 746–748 (Aug. 5, 1996).

Peterkin, F.E., et al., "Electric Field Mapping System with Nanosecond Temporal Resolution," *Rev. Sci. Instrum.*, vol. 66, No. 4, pp 2960–2966 (Apr. 1995).

Peterson, K.A., et al., "Electric–Field–Induced Second–Harmonic Generation in GaN Devices," *Optics Letters*, vol. 26, No. 7, pp 438–440 (Apr. 1, 2001).

Sardesai, H.P., et al., "An Optical Technique for Measurement of Semiconductor Surface Electric Fields," *Rev. Sci, Instrum.*, vol. 63, No. 8, pp 3918–3922 (Aug. 1992).

Siegman, A.E., "Lasers" TEXTBOOK, Univ Science Books, Mill Valley CA, Chapter 17.2, pp 675–679 (1986).

Wiesenfeld, J.M., "Electro–Optic Sampling of High–Speed Devices and Integrated Circuits," *IBM J. Res. Develop.*, vol. 34, No. 2/3, pp 141–161 (Mar./May 1990).

* cited by examiner

ELECTRO-OPTIC ELECTRIC FIELD PROBE

CROSS-REFERENCE TO RELATED APPLICATIONS

This application claims the benefit of the filing of U.S. Provisional Patent Application Serial No. 60/191,909, entitled "Novel Electric Field Probe for High-Speed Integrated Circuits and Semiconductor Devices", filed on Mar. 24, 2000, and the specification thereof is incorporated herein by reference.

GOVERNMENT RIGHTS

The U.S. Government may have a paid-up license in this invention and the right in limited circumstances to require the patent owner to license others on reasonable terms as provided for by the terms of Grant No. DMI-9660557 awarded by the U.S. National Science Foundation.

BACKGROUND OF THE INVENTION

1. Field of the Invention (Technical Field)

The present invention relates to electric field probes for high-speed integrated circuits and semiconductor devices.

2. Background Art

Note that the following discussion refers to a number of publications by author(s) and year of publication, and that due to recent publication dates certain publications are not to be considered as prior art vis-a-vis the present invention. Discussion of such publications herein is given for more complete background and is not to be construed as an admission that such publications are prior art for patentability determination purposes.

Operating speeds of electronic devices and integrated circuits (IC) are rapidly surpassing the capabilities of conventional electronic measurement instrumentation. Evaluation of fast semiconductor devices requires both high temporal resolution and the ability to probe internal points of an IC noninvasively. While optical methods promise ultrashort temporal resolution (~50 fs) and noninvasive probing of internal structures of ICs, conventional electro-optic sampling requires semiconductors without inversion symmetry such as GaAs and InP. Centrosymmetric semiconductors such as silicon and germanium require an external electro-optic probe placed within the fringe electric field flux lines of the region of interest, reducing sensitivity and adding parasitic capacitance to the probed circuit. Since silicon MOSFET technology is the dominate technology used in logic and memory devices, it is important to develop non-invasive techniques that work on both centrosymmetric silicon-based devices in addition to GaAs and InP devices.

Conventional electronic measurement systems are no longer adequate to measure waveforms in the fastest electronic devices and integrated circuits. Fortunately, the fastest electronic devices have tended to be III–IV based semiconductors that are not centrosymmetric. Because of the lack of inversion symmetry in these crystals, they exhibit the Pockels effect. When an electric field is applied to a substance that exhibits the Pockels effect, the polarization of a probe beam passing through the substance can be rotated. This rotation is proportional to the applied electric field, and is easily observed by either transmission through crossed polarizers or a phase sensitive interferometer. Techniques and devices have been developed that take advantage of the Pockels effect to probe electric fields in various semiconductors that are not centrosymmetric. These instruments do not function on centrosymmetric semiconductors such as silicon or germanium, however. With clock rates of commercial silicon-based devices approaching 1 GHz and beyond, new technologies are needed to probe these devices.

One approach to probe centrosymmetric semiconductors is to place a minute external probe, composed of material that exhibits the Pockels effect, very close to the device/region to be probed. J. M. Wiesenfield, *IBM J. Res. Develop.*, 34:141 (1990). Unfortunately, such an approach cannot image or probe internal devices in the integrated circuit. Also, such approaches can add parasitic capacitance to the device being probed which will skew any measurements. The present invention comprises a general technique for probing semiconductor devices and integrated circuits that is useful with any semiconductor material. Since the method of the present invention does not use an external probe, it is adaptable to imaging and does not add any parasitic capacitance.

The present invention relies on DC electric field induced second harmonic generation (which we call Field Induced Second Harmonic generation, or FISH). Use of FISH for the applications described herein comprises a sensitive probe for a p-n junction of a semiconductor device. The present invention is applicable to semiconductor device research and to the development and testing of commercial integrated circuits.

Publications providing background to the present invention include: K. A. Peterson, et al., *Opt. Lett.*, 26:438 (2001); K. A. Peterson, et al., OSA Nonlinear Optics, Materials, Fundamentals, and Applications Topical Meeting, Kaua'i, Hi. (August 2000); and D. J. Kane et al., OSA Annual Meeting, Providence, R.I. (October 2000).

SUMMARY OF THE INVENTION
(DISCLOSURE OF THE INVENTION)

The present invention is of a non-invasive electro-optic probe and probe method for probing electric fields in semiconductor devices comprising: directing laser output at a semiconductor device being probed employing a laser having an operating wavelength such that photon energy of a second harmonic wavelength of the operating wavelength is below a band gap of a semiconductor comprised by the semiconductor device being probed; and detecting second harmonic wavelength but not operating wavelength radiation from the semiconductor device being probed. In the preferred embodiment, the laser is a mode-locked laser. The detection apparatus comprises a photomultiplier tube, preferably with an interference filter to minimize two-photo absorption in a photocathode of the photomultiplier tube. Phase sensitive detection of the second harmonic wavelength is employed, preferably detecting the second harmonic wavelength at a frequency difference between an electric field modulation and a probe modulation, and preferably via a chopper between the laser and the material to be probed and a lock-in amplifier receiving output from the detection apparatus and providing input to the laser. The semiconductor device is preferably operated while it is being probed, and the electric field probed is preferably that present at a p-n junction of the semiconductor device being probed. The electric field probed is preferably modulated.

A primary object of the present invention is to use DC electric field induced second harmonic (FISH) generation to measure electric fields in electronic devices.

A primary advantage of the present invention is that it is robust in nature because of its inherent background free technique for probing integrated circuits.

Another advantage of the present invention is that it is sufficiently sensitive for the measurement of electric fields in semiconductors.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS

BEST MODES FOR CARRYING OUT THE INVENTION

Figure 1:
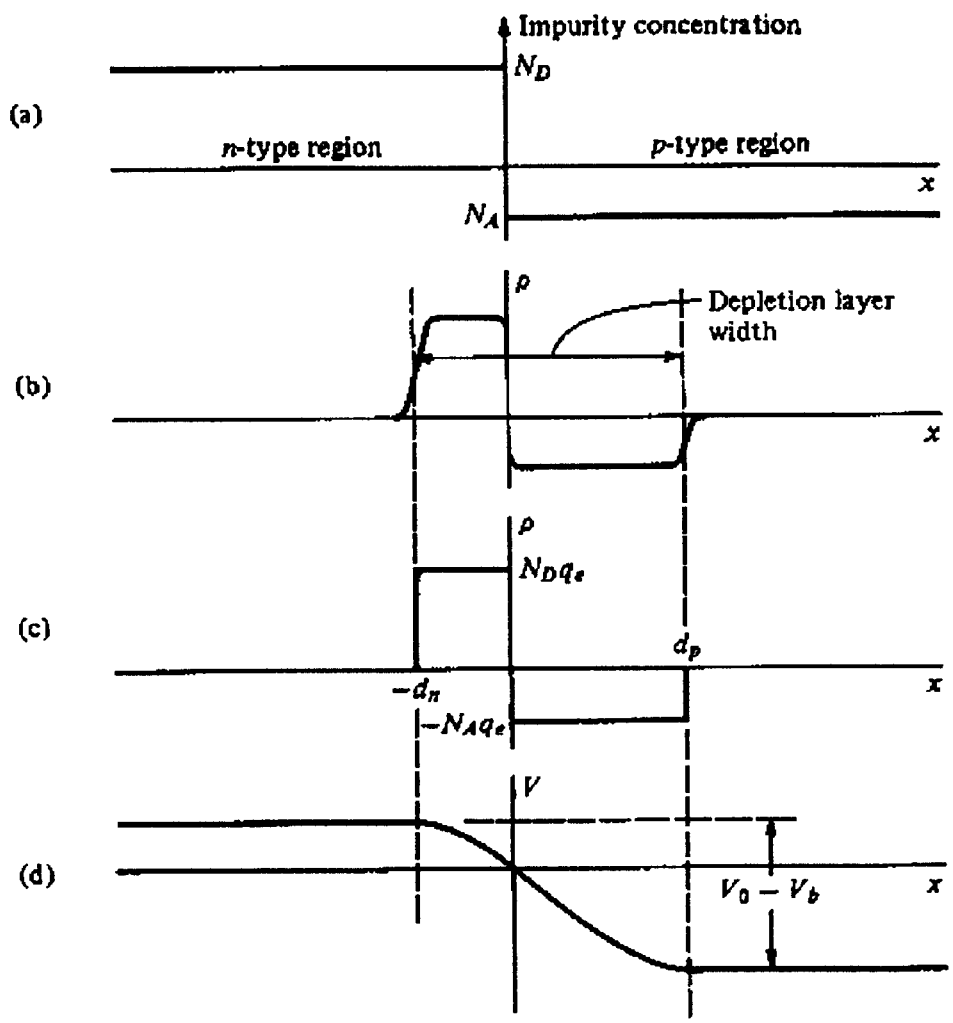
FIG. 1 is a plot of characteristics of a p-n junction, (a) showing impurity concentration, (b) showing net charge density, (c) showing idealized net charge density, and (d) showing potential distribution.

The present invention is of an electro-optic method and apparatus for probing electric fields, and hence waveforms, in integrated circuits noninvasively and without external probes. The inventive technique works on any semiconductor regardless of its crystal structure, and is useful for both imaging and single point detection without degradation of temporal resolution. Because the inventive technique is optically based, no parasitic capacitance is added to the device being measured. According to the present invention, a femtosecond laser probes the device to be measured; thus its temporal resolution is several orders of magnitude faster than the time resolution required to probe present devices. The inventive method is specific to only the depletion layer of the p-n junction or metal-semiconductor junction being probed. Other parts of the device are ignored. The optical nature of the technique of the present invention permits internal device structures of an integrated circuit to be monitored. In addition, the inventive method for measuring the electric fields present in semiconductor devices is effective on centrosymmetric semiconductors such as silicon as well as any other semiconductor. The present invention's potential benefit to industry, government, and academia is enormous, allowing integrated circuits to be probed and p-n junctions to be studied and imaged.

At first glance, it would seem that electric fields in semiconductors are relatively small because of the small voltages used in typical semiconductor devices. This is not the case, however, as voltages can be as high as $10^7$ V/cm because the actual p-n junctions are very narrow. A. Fowler, *Physics Today*, 50:50 (1997). The method of the present invention takes advantage of these large, localized electric fields to produce a background free signal that is proportional to the electric field in the probed semiconductor device. The inventive method is versatile; integrated circuits are probed one device at a time and/or imaged. Waveforms across the depletion layer are measurable to nearly femtosecond resolution.

The present invention comprises a sensitive, practical and versatile way to probe integrated circuits. DC electric field induced second harmonic generation provides for an inventive method for measuring waveforms and electric fields in integrated circuits and high-speed electronics. The present invention comprises detection limits and robustness against background and scatter; i.e., its signal-to-noise ratio. The present invention also comprises an integrated circuit diagnostic that can measure electronic waveforms and electric fields.

The present invention relies on DC electric field induced second harmonic generation (which we call Field Induced Second Harmonic generation, or FISH). Use of FISH for the applications described herein is novel and comprises a sensitive probe for a p-n junction of a semiconductor device. The present invention is applicable to semiconductor device research and to the development and testing of commercial integrated circuits.

When an electric field is applied to a material, the electrons in the material polarize. This polarization is given by:

$$P=\epsilon(\chi^{(1)}E+\chi^{(2)}E^2+\chi^{(3)}E^3+ \ldots )$$

where $\epsilon$ is the permittivity, E is the electric field, $\chi^{(1)}$ is the linear susceptibility, and the quantities $\chi^{(2)}$, $\chi^{(3)}$, . . . are called the nonlinear susceptibilities of the medium. The index of refraction, n, the real part of $(\chi^{(1)}+1)$, is used to describe the polarization of a material when the electric field is small and the electrons are driven harmonically by electromagnetic radiation, such as light (although not limiting, the discussion uses light as an example of a particular range of electromagnetic radiation). However, when electric fields are large, electron motion becomes anharmonic causing nonlinear polarizations which in turn cause phenomenon such as frequency doubling of light, the Pockels effect, the Kerr effect, and frequency tripling of light. $\chi^{(2)}$ is the term that is responsible for the frequency doubling of light and the Pockels effect. However, this term is nonzero for a given material only when inversion symmetry is broken as in GaAs and InP. For homogenous materials that are centrosymmetric, such as Si, Ge, and gases, $\chi^{(2)}=0$. Thus, the Pockels effect, which is most commonly used to probe semiconductor devices, can not be used to probe any centrosymmetric material without using an external probe.

Unfortunately, external optical probes monitor only fringe fields and can add parasitic capacitances. How can a semiconductor device be probed noninvasively when its $\chi^{(2)}=0$? Fortuitously, all materials have a nonzero $\chi^{(3)}$ that can be used to probe electric fields directly. In fact, semiconductors have some of the largest $\chi^{(3)}$'s of any material. The present invention takes advantage of these large $\chi^{(3)}$'s by using the optical Kerr effect and/or DC electric field induced second harmonic generation. For background concerning these effects, see P. N. Butcher et al., *The Elements of Nonlinear Optics*, Cambridge University Press, Cambridge, p. 26 (1990); G. Lüpke, et al., *Opt. Lett.*, 20:1997 (1995); C. Meyer, et al., *Phys. Rev. Lett.*, 74:3001 (1995); O. A. Aktsipetrov, et al., *Opt. Lett.*, 19:1451 (1994); C. S. Mullin, et al., *Phys. Rev. Lett.*, 74:2678 (1995); Y. Murooka, et al.,

*Rev. Sci. Instrum.,* 63:5582 (1992); H. P. Sardesai, et al., *Rev. Sci. Instrum.,* 63:3918 (1992); and F. E. Peterkin, et al., *Rev. Sci. Instrum.,* 66:2960 (1995).

In the preferred embodiment of the present invention, DC electric field induced second harmonic generation is used because it is a background free technique that is immune to the effects of scattered light. In the case of DC electric field induced second harmonic generation, $P \chi^{(3)} E_{DC} E_{probe}^2$. The internal electric field, EDC, together with $\chi^{(3)}$ create an effective $\chi^{(2)}$ that interacts with $E_{probe}$ to generate the second harmonic of $E_{probe}$. While generally a weak effect, because of the large DC electric fields present in semiconductors in the depletion layer and the large $\chi^{(3)}$'s of semiconductors, this effect is strong and observable.

One of the main reasons why the present invention works so well is that while average electric fields in a semiconductor device are fairly small, peak electric fields in the depletion region of semiconductor devices are very large. FIG. 1 shows several characteristics of p-n junctions. FIG. 1(a) shows the impurity concentrations in a p-n junction. FIG. 1(b) shows the net charge density and the depletion layer width. The idealized net charge density is shown in FIG. 1(c), and FIG. 1(d) depicts the potential distribution that shows that the voltage drops only over the depletion layer. Since $E_{DC}$, the electric field is defined as dV/dx, the average $E_{DC} \sim (V_0 - V_b)/d$, where d is the depletion layer width.

To find the width of the depletion layer, Poisson's Equation for the semiconductor p-n junction is solved:

$$\frac{d^2\varphi}{dx^2} = -\frac{\rho}{\varepsilon} = -\frac{en_d}{\varepsilon}[1 - \exp(e\varphi/\tau)]$$

where $\phi$ is the potential, $\rho$ is the charge density, $\epsilon$ is the permittivity, $n_d$ is the donor density, T is the temperature, and e is the magnitude of the charge on an electron. C. Kittel, et al., *Thermal Physics,* W. H. Freeman and Company, San Francisco, pp. 373–378 (1980). Solving for the peak electric field gives:

$$E = \left(\frac{2e}{\varepsilon}\frac{n_a n_d}{n_a + n_d}\left(V_0 - V_b - \frac{2\tau}{e}\right)\right)^{1/2}$$

where $n_a$ and $n_d$ are the acceptor and donor densities, respectively, and $V_0 - V_b$ is the voltage drop across the depletion layer. The total depletion layer width, d, is given by:

$$d = \left(\frac{2e}{\varepsilon}\frac{n_a + n_d}{n_a n_d}\left(V_0 - V_b - \frac{2\tau}{e}\right)\right)^{1/2}.$$

Assuming that $n_a = n_d = 10^{15}$ cm$^{-3}$, $\epsilon = 10\epsilon_0$ ($\epsilon_0 = 10^{-9}/36\pi$ F/m), and $V_0 - V_b - 2\tau/e = 1$ volt, then, the peak electric field, $E_{peak} = 4.25 \times 10^4$ Vcm$^{-1}$ and d=0.47 $\mu$m. C. Kiftel, et al. Since the electric field varies linearly across the depletion layer, $E_{AVE} \sim E_{peak}/2$.

From the above, one sees that the electric field can be quite large and highly localized.

According to the present invention, this large electric field is used to probe the electric field in the depletion region. From the discussion above, when a probe laser is sent into a semiconductor, a polarization results that is proportional to $\chi^{(3)} E_{DC} E_{probe}^2$ where $E_{DC}$ is the electric field across the depletion layer and $E_{probe}$ is the electric field produced by the probe laser. Together, these two fields produce a polarization that varies at twice the fundamental frequency of $E_{probe}$.

Figure 2:
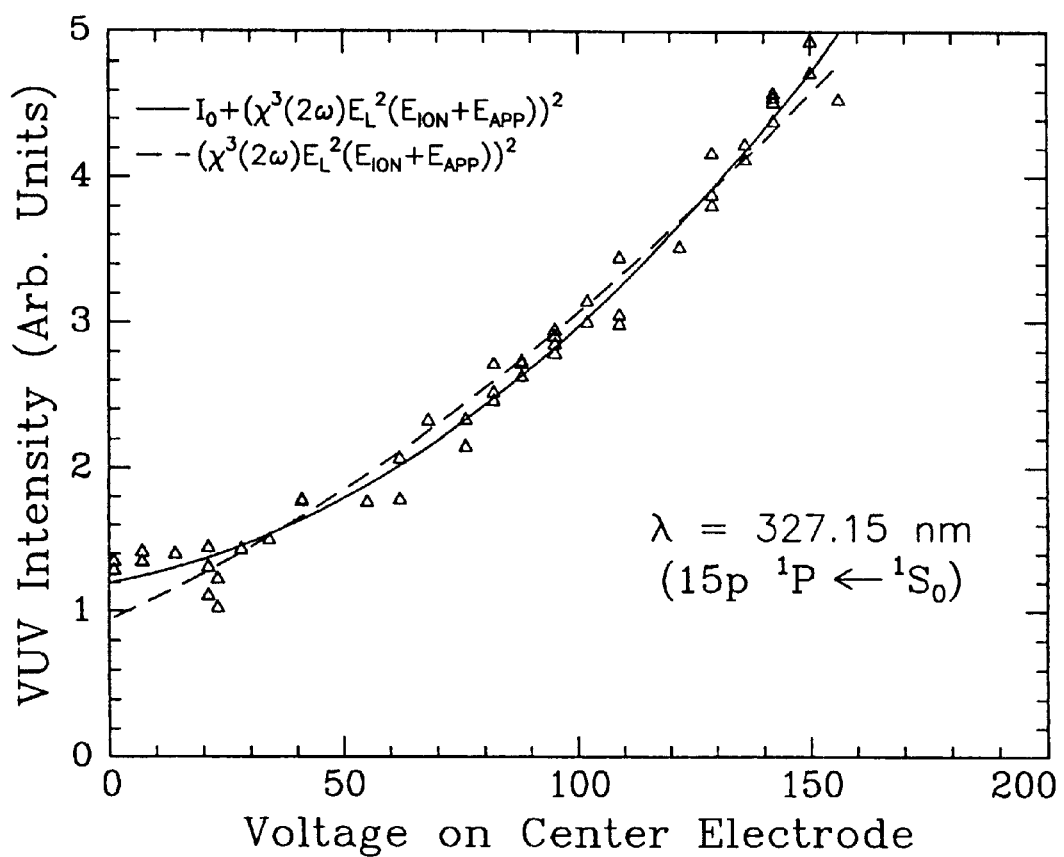
FIG. 2 is a plot of DC electric field induced second harmonic generation intensity as a function of applied voltage for doubling a UV laser in magnesium vapor (producing vacuum UV light)

FIG. 2 shows an example of DC electric field induced second harmonic generation in metal vapors. The total DC field is actually the sum of two contributions: the external field and a DC field created when metal atoms ionize via 3-photon absorption. The second field is generated when the residual kinetic energy of the electrons cause a spatial separation between the ions and the electrons. Mullin et al. As shown in FIG. 2, addition of a modest external electric field (~5000 V/m) enhances the second harmonic intensity. This effect is theoretically stronger in semiconductors than in metal vapors because $\chi^{(3)}$ is larger. Indeed, DC electric field induced second harmonic generation has been observed in semiconductors by Lupke et al, Meyer et al, and Aktsipetrov et al.

In those studies, the DC electric field induced second harmonic was observed at semiconductor interfaces that were either metal-semiconductor junctions or semiconductor-insulator interfaces. The work of G. Lüpke et al. focused on the measurement of FISH in Schottky barriers due to metal-semiconductor junctions. A 30 mW beam from a mode-locked Ti:sapphire laser was reflected from a region of silicon between two gold electrodes. An enhancement of the SHG was observed when the gold-silicon junction was reversed biased. C. Meyer et al. studied Si(111)/SiO$_2$ interfaces and Si(111)/Si$_3$N$_4$ interfaces. Mostly, this study took advantage of SHG resulting from the $\chi^{(2)}$ produced by breaking inversion symmetry at the interface rather than FISH. Studies of FISH on Si—SiO$_2$ interfaces were conducted by O. A. Aktsipetrov et al. These studies observed the second harmonic of a 15 ns Nd:YAG pulse at 1.064 $\mu$m. A detailed analysis of these studies undertaken by applicant showed that observing FISH from a p-n semiconductor junction would be possible. However, these studies teach that the probe wavelength may be such that the photon energy of the probe is above the band gap of the semiconductor. These studies do not explicitly state that probe photon energy below the band gap of the semiconductor may be preferable. Furthermore, these studies do not indicate that the photon energy of the second harmonic of the probe should be below the band gap of the semiconductor and instead suggest that the photon energy of the second harmonic of the probe may be above the band gap (A. Nahata, et al., Appl. Phys. Lett. 69:746 (1996)). The present invention specifically addresses the preference for the photon energy of the second harmonic of the probe to be below the band gap of the semiconductor for two reasons. First, carriers produced by two photon absorption in the semiconductor may obscure the probed electric field. Second, the carriers produced by two photon absorption induce current making the technique invasive. To make the probe non-invasive and sensitive, two photon absorption, in addition to one photon absorption, must be minimized and production of second harmonic must be maximized.

Determination of the magnitude of an expected signal a priori requires calculation the $\chi^{(3)}$ of the particular semiconductor. $\chi^{(3)}$ is related to a commonly measured parameter know as the intensity dependent index of refraction, $\chi'_2$, is given by:

$$n_2^I = -\frac{e^2 \tau_R \alpha}{2m_e n_0 e_0 \hbar \omega^3}$$

where $m_e$ is the effective mass of the electrons, $n_0$ is the index of refraction, $\tau_R$ is the carrier relaxation time, $\hbar\omega$ is the photon energy, and $\alpha$ is the absorption coefficient in the linear regime. For typical values ($m_e$=0.1 m, $n_0$=3.5, $\alpha$=106 m-1, $\hbar\omega$=0.75 eV, and $\tau_R$=10 ns), $n'_2$~3×10$^{-3}$ cm$^2$/kW. However, because the pump laser typically operates far below the bandgap absorption to insure that the doubled light does not get absorbed, $\alpha$~10/m which reduces $n'_2$~3×10$^{-8}$ cm$^2$/kW. Since $n'_2$(cm$^2$/kW)~3Re($\chi^{(3)}$)(esu), where "Re" refers to the real part, $\chi^{(3)}$~10$^{-8}$(esu). To convert esu units to SI units, $\chi^{(n)}$ must be multiplied by $4\pi/(10^{-4}c)^{n-1}$ where c is the speed of light; consequently, $\chi^{(3)}$~1.4×10$^{-16}$ (SI).

Taken together, $\chi^{(3)}E_{DC}$ can be thought of as an effective $\chi^{(2)}$ which is denoted as $\chi^{(2)}_{\text{eff}}$. Using this constant, one can use the slowly varying envelope approximation to calculate the expected second harmonic intensity, $I_{2\omega}(L)$, $$I_{2\omega}(L) = \frac{(2\omega)^2}{8\varepsilon_0 c^3} \frac{|\chi^{(2)}_{\text{eff}}|^2}{n_\omega^2 n_{2\omega}} I_\omega^2 L^2 \text{sinc}^2(\Delta kL/2)$$

where $\omega$ is the frequency of the probe laser, $\epsilon_0$ is the permittivity of free space, c is the speed of light, $n_\omega$ is the index of refraction at the probe wavelength, $n_{2\omega}$ is the index of refraction at the second harmonic of the probe wavelength, $I_\omega$ is the intensity of the probe laser, L is the interaction length, and the sinc function refers to the phase matching condition which is discussed below. For L=4.7×10$^{-7}$ m, $I_\omega$=4×10$^{13}$ W/m$^2$ ($I_\omega$ is assumed to be produced by one 50 fs pulse from a 400 mW CW mode-locked Ti:sapphire laser focused to a spot 56 μm in diameter which is ~×2 the diffraction limit for a 10 cm focal length, A. E. Siegman, Lasers, University Science Books, Mill Valley, Calif., p. 676 (1986)), $\chi^{(3)}$=1.4×10$^{-16}$ m$^2$/V$^{-2}$, $E_{DC}$=4×10$^6$ V/m, $n_\omega$=$n_{2\omega}$~3.5, $\omega$=2$\pi$(3×10$^8$ m/s)/(940×10$^{-9}$m), and $\epsilon_0$=8.85×10$^{-12}$, $I_{2\omega}(L)$=5.4×10$^9$ W/m$^2$.

In these calculations, a pulse width of 50 fs is assumed so that the total energy is 6.4 fJ or 15,000 photons/pulse which is easily detectable. Indeed, because the time resolution is determined by the laser pulse width and not the detection electronics, according to the present invention, very sensitive, low bandwidth detectors and electronics are practical. Even with a collection frequency of less than 0.1%, this signal is easily detectable by photomultiplier tubes. Furthermore, the present invention encompasses use of asynchronous sampling (e.g., running a repetitive waveform at a different frequency than the laser) (synchronous sampling is also possible) and averaging (e.g., repetition of the laser set at approximately 80 MHz) which in turn can detect signals from probes that are approximately 1/1000 of the laser power. The aforementioned calculation neglects resonant enhancement due to the generated second harmonic being close to the bad gap of the semiconductor. Consequently, the results of this calculation represents a worst case scenario.

Phase matching allows the fundamental and the second harmonic to remain coherent. When the two frequencies 2ω and ω are coherent, they are synchronous and the second harmonic is generated efficiently; in other words, all parts of the polarization wave generating the second harmonic interfere constructively adding to the overall second harmonic intensity. However, if the phase mismatch, $\Delta k$, is large and the distance over which the second harmonic light is generated, L, is large enough, some of the parts of the polarization wave will destructively interfere with other parts reducing the overall second harmonic intensity. Butcher et al.

The critical distance, $L_c$, the distance over which the second harmonic wave becomes 180 degrees out of phase with the fundamental frequency, is defined to be $L_c = |\pi/\Delta k|$. For purposes of a preferred embodiment of the present invention, the second harmonic is generated only over the depletion layer which typically is ~5×10$^{-5}$ cm. For example, setting $L_c$=5×10$^{-5}$ cm, then the difference in the index of refraction between the fundamental frequency and the second harmonic, $\Delta n$<0.5, whereas for most nonbirefringent crystals such as GaAs and Si, $\Delta n$<<0.1 ($L_c$~10–100 μm). Butcher et al. Therefore, according to the present invention, for DC electric field induced second harmonic generation in semiconductors, phase matching issues can be neglected.

In the preferred embodiment, the present invention comprises a mode-locked laser to sample the p-n junction electric field. This laser operates in a wavelength band such that the photon energy of the second harmonic of the output wavelength is at or below the band gap of the semiconductor to be probed. Accordingly, neither the fundamental wavelength nor the second harmonic is absorbed in the semiconductor. To apply the inventive method to silicon, an ultrafast source in the 2 μm region is preferred. In this particular embodiment, a blue LED is used as a sample p-n junction to be probed. This LED is transparent to both the fundamental Ti:sapphire wavelength (940 nm) and the second harmonic of the fundamental Ti:sapphire wavelength (470 nm). The fact that this device produces blue light is immaterial as it does not affect data collection or the conclusions. All that is required is transparency at the probe wavelength and the frequency doubled probe wavelength. The present invention is directly applicable to any semiconductor, regardless of symmetry.

To improve the signal-to-noise ratio, a preferred embodiment of the present invention comprises a detection system specific to the second harmonic of a passively mode-locked Ti:sapphire laser. In a preferred embodiment of the present invention, such a laser outputs ~50 fs pulses at approximately 80 MHz with a CW power of approximately 400 mW. To insure detection of small second harmonic signals, this embodiment observes second harmonic generation from surfaces such as GaAs. (Second harmonic generation occurs at surfaces because the inversion symmetry of the material is broken at an interface.) These signals are readily observed and are approximately the same level of a DC electric field induced second harmonic.

In the preferred embodiment of the present invention, a laser is tuned to a wavelength (~940 nm) such that the second harmonic is approximately at the emission wavelength of a blue LED (~470 nm). This embodiment comprises a photomultiplier tube (PMT) that is blind to the emission wavelength of the Ti:sapphire laser, but that is sensitive to the second harmonic. This embodiment also comprises an interference filter to block the fundamental to insure two photon absorption in the photocathode is minimized. To detect the second harmonic, a preferred embodiment of the present invention comprises phase sensitive detection. In such a system, the laser is chopped at ~2 kHz and lock-in detection is used.

The present invention is useful for detection of the second harmonic light generated by the interaction of a Ti:sapphire laser beam with the electric field present at a p-n junction in a blue LED. These devices are generally either SiC or GaN; however, the DC electric field induced second harmonic is easily separated from any second harmonic that is generated from doubling in the crystal itself by measuring the second harmonic light as a function of applied voltage. Detection of the second harmonic from silicon devices requires a longer operational wavelength. In order for the laser probe to reach the depletion layer, the semiconductor must be transparent at the probe frequency. In order avoid absorption of the second harmonic, the second harmonic photon energy must be below the band gap of the semiconductor of interest. Thus, the probe must be roughly one-half the bandgap energy. For silicon, the probe must be about 2 μm. Detection of the second harmonic from silicon is accomplished by the present invention, for example, through use of an OPO or another type of mode-locked ultrafast laser that generates the required 2 μm radiation to probe silicon electronic devices.

Figure 3:
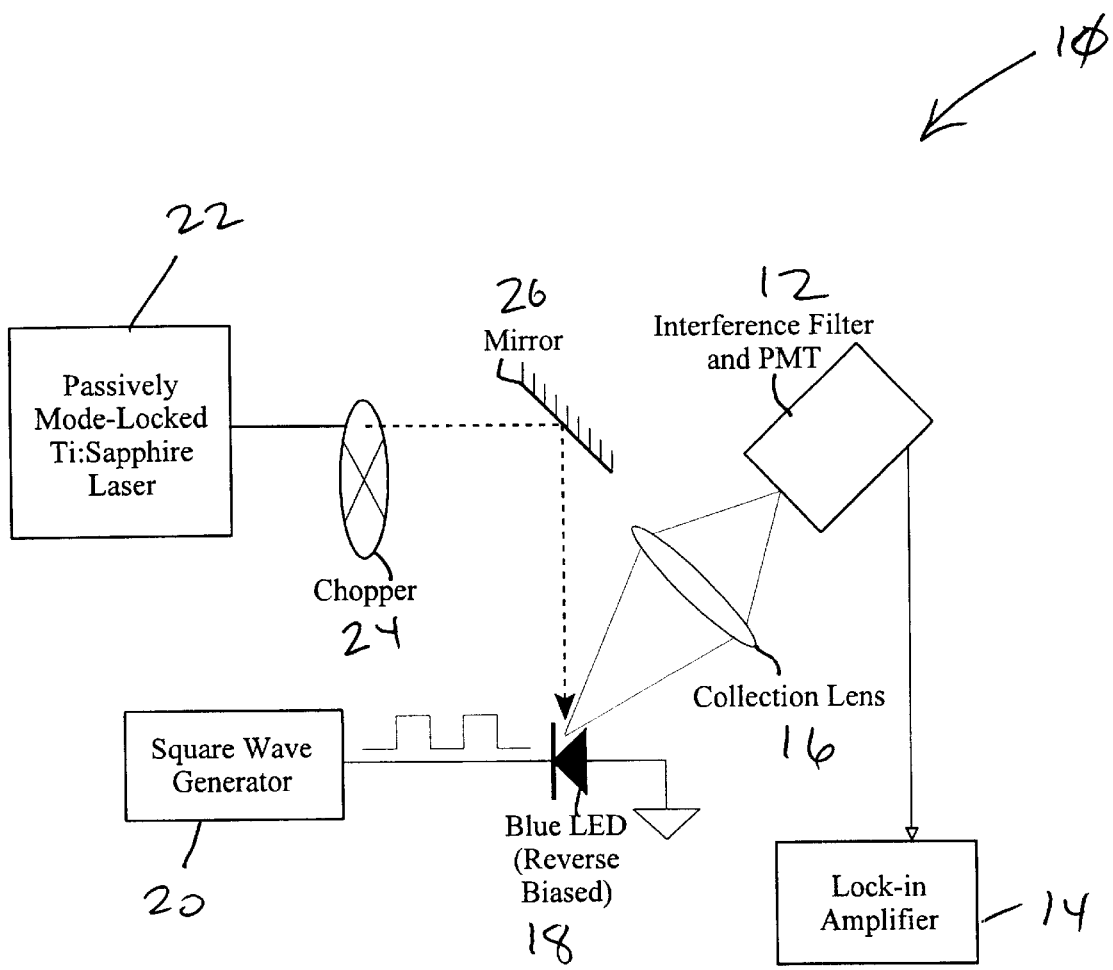
FIG. 3 is a schematic of a preferred embodiment of the present invention to collect DC electric field induced second harmonic light from a reverse biased blue LED.

FIG. 3 is a schematic diagram of the preferred embodiment of the present invention 10 probing semiconductor 18. The output from a passively mode-locked Ti:sapphire laser 22 preferably pumped by an Ar+ laser (not shown), an 80 MHz train of 50 fs pulses, is sent onto the p-n junction of an LED. The average output power of the laser is ~400 mW; each pulse is ~5 nJ. When focused to spots ~50 μm in diameter, these pulses produce intensities as high as $4 \times 10^{13}$ W/m$^2$. The output of this laser is optionally chopped 24 at a frequency $f_1$ and focused onto a reverse biased blue LED 18 (the semiconductor being probed) via mirror 26. The voltage waveform into the blue LED is a square wave from square wave generator 20 at a frequency $f_2$ with $f_2 \gg f_1$.

The present invention preferably comprises a collection optic 16 to image the interaction region between the laser and the blue LED onto a PMT through an interference filter 12. The output from the PMT is, for example, sent into a lock-in amplifier 14 set to detect a frequency of $f_1+f_2$. After second harmonic light is detected using the inventive apparatus shown in FIG. 3, different waveforms are optionally used to measure relative differences in the reverse bias. For example, the level of the square wave is variable which in turn varies the intensity of the second harmonic radiation. Again, the present invention is useful for observation of DC electric field induced second harmonic light.

Use of a relatively high power can produce appreciable two-photon absorption in a semiconductor. This phenomenon can add unwanted current to devices, thereby skewing measurements. In a preferred embodiment, to minimize two photon absorption, the present invention comprises a Ti:sapphire laser tuned to a wavelength that has a photon energy less than one-half of the band gap of the semiconductor, in this instance, for example, a blue LED. In determining if electron-hole pairs produced by two-photon absorption of the laser affect measurements, the current from the blue LED is measured using a picoammeter allowing currents as small as 10 fA to be detected.

Optical damage of the semiconductor device at the power levels used in conjunction with the present invention are not appreciable because the damage threshold is inversely proportional to the square root of the pulse duration.

Other observable effects may be useful for both probing integrated circuits and studying semiconductor devices such as the optical Kerr effect and two-photon absorption. For example, the optical Kerr effect is observable by measuring the polarization rotation of the probe beam after passing through the semiconductor device to be probed. While it is not truly background free (probe scatter can obscure the signal), it has the advantage of not requiring the semiconductor to be transparent at the second harmonic of the probe wavelength. The present invention is also suitable for examination of other observable effects to probe electric fields in semiconductor junctions.

Commercial applications of the present invention are numerous. With the continuing development of compact, rugged, turn-key fiber-based ultrafast lasers, this technology will be affordable for any corporation or research institution that requires it. The present invention is not only an invaluable research tool that is capable of directly probing the depletion layer of a semiconductor device, but it also has important applications in the semiconductor industry on the whole. The present invention is able to image the electric fields present in an integrated circuit. Sampled over time, waveforms within an integrated circuit are imaged directly and noninvasively by the present invention.

The present invention is expected to open up many opportunities in areas other than semiconductor device probing. FISH occurs in all substances and it is possible to use this technique in medical imaging technologies. For example, FISH is useful in microscopy to image two-photon absorption profiles compounds present in cells that do not fluoresce.

Overall, the present invention comprises a novel electro-optic method for probing electric fields, and hence waveforms, in integrated circuits noninvasively without external probes. The inventive technique and associated apparatus works on any semiconductor regardless of its crystal structure, and is useful for both imaging and single point detection without degradation of temporal resolution. Because the inventive technique is optically based, no parasitic capacitance is added to the device being measured. A femtosecond laser probes the device to be measured; thus the technique's temporal resolution is several orders of magnitude faster than the time resolution required to probe present devices. Silicon MOSFET technology is the dominate technology used in logic and memory devices and the present invention's noninvasive technique work on such silicon-based devices. The method of the present invention measures electric fields present in semiconductor devices and is effective on silicon as well as any other semiconductor. The benefit to industry, government, and academia is enormous, allowing integrated circuits to be probed and p-n junctions to be studied and imaged.

The present invention is applicable to the development of techniques for studying semiconductor devices, and the development of instrumentation to measure electronic waveforms in integrated circuits noninvasively. Such instrumentation is useful to diagnose problems in integrated circuits during development, on production lines, and in circuit boards.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A non-invasive electro-optic probe for probing electric fields in semiconductor devices, said probe comprising:

a laser having an operating wavelength such that photon energy of a second harmonic wavelength of said operating wavelength is below a band gap of a semiconductor comprised by a semiconductor device being probed, said laser output being directed at the semiconductor device being probed; and detection apparatus receiving radiation from the semiconductor being probed, said detection apparatus being sensitive to said second harmonic wavelength but not to said operating wavelength.

2. The probe of claim 1 wherein said laser comprises a mode-locked laser.

3. The probe of claim 1 wherein said detection apparatus comprises a photomultiplier tube.

4. The probe of claim 3 wherein said detection apparatus additionally comprises an interference filter to minimize two-photo absorption in a photocathode of said photomultiplier tube.

5. The probe of claim 1 additionally comprising means for phase sensitive detection of said second harmonic wavelength.

6. The probe of claim 5 wherein said detection apparatus is sensitive to said second harmonic wavelength at a frequency difference between an electric field modulation and a probe modulation.

7. The probe of claim 5 wherein said phase sensitive detection means comprises a chopper between said laser and the material to be probed and a lock-in amplifier receiving output from said detection apparatus and providing input to said laser.

8. The probe of claim 1 additionally comprising means for operating the semiconductor device while it is being probed.

9. The probe of claim 1 wherein the electric field probed is that present at a p-n junction of the semiconductor device being probed.

10. The probe of claim 9 wherein the electric field probed is modulated.

11. A non-invasive electro-optic probe method for probing electric fields in semiconductor devices, the method comprising the steps of:

directing laser output at a semiconductor device being probed employing a laser having an operating wavelength such that photon energy of a second harmonic wavelength of the operating wavelength is below a band gap of a semiconductor comprised by the semiconductor device being probed; and detecting second harmonic wavelength but not operating wavelength radiation from the semiconductor device being probed.

12. The method of claim 11 wherein in the directing step the laser comprises a mode-locked laser.

13. The method of claim 11 wherein the detecting step comprises employing a photomultiplier tube.

14. The method of claim 13 wherein the detecting step additionally comprises employing an interference filter to minimize two-photo absorption in a photocathode of the photomultiplier tube.

15. The method of claim 11 additionally comprising the step of employing phase sensitive detection of the second harmonic wavelength.

16. The method of claim 15 wherein the detecting step detects the second harmonic wavelength at a frequency difference between an electric field modulation and a probe modulation.

17. The method of claim 15 wherein the employing step comprises employing a chopper between the laser and the material to be probed and a lock-in amplifier receiving output from the detection apparatus and providing input to the laser.

18. The method of claim 11 additionally comprising the step of operating the semiconductor device while it is being probed.

19. The method of claim 11 wherein the electric field probed is that present at a p-n junction of the semiconductor device being probed.

20. The method of claim 19 wherein the electric field probed is modulated.

* * * * *